United States Patent [19]

Schornick et al.

[11] Patent Number: 4,714,751

[45] Date of Patent: Dec. 22, 1987

[54] CROSSLINKABLE RESIN, PHOTOSENSITIVE RECORDING MATERIAL BASED ON THIS CROSSLINKABLE RESIN, AND PRODUCTION OF A LITHOGRAPHIC PRINTING PLATE USING THIS PHOTOSENSITIVE RECORDING MATERIAL

[75] Inventors: Gunnar Schornick, Neuleiningen; Albert Elzer, Otterstadt; Reiner Hofmann, Neustadt, all of Fed. Rep. of Germany

[73] Assignee: BASF Aktiengesellschaft, Ludwigshafen, Fed. Rep. of Germany

[21] Appl. No.: 810,191

[22] Filed: Dec. 18, 1985

[30] Foreign Application Priority Data

Dec. 24, 1984 [DE] Fed. Rep. of Germany ....... 3447355

[51] Int. Cl.$^4$ .................... C08G 59/14; C08G 63/12; G03C 1/727
[52] U.S. Cl. ................................. 528/103; 528/296; 528/272; 528/307; 528/308; 528/308.6; 522/100; 430/285; 430/280
[58] Field of Search ............... 528/103, 296, 272, 307, 528/308, 308.6; 430/280, 285; 522/100

[56] References Cited

U.S. PATENT DOCUMENTS

| | | | |
|---|---|---|---|
| 3,218,167 | 11/1965 | Burg | 96/85 |
| 3,884,693 | 5/1975 | Bauer et al. | 96/15 |
| 3,923,523 | 12/1975 | Nishikubo et al. | 528/296 X |
| 4,146,452 | 3/1979 | Weber et al. | 522/100 X |
| 4,311,726 | 1/1982 | Hacker et al. | 522/100 X |

FOREIGN PATENT DOCUMENTS 0055924 4/1982 Japan ................. 528/296
1489425 10/1977 United Kingdom .

*Primary Examiner*—John E. Kittle
*Assistant Examiner*—Cynthia Hamilton
*Attorney, Agent, or Firm*—Keil & Weinkauf

[57] ABSTRACT

Oligomeric resins are crosslinkable by polymerization, soluble or dispersible in aqueous alkaline solutions, preferably contain more than 2 (meth)acryloyl groups and free carboxyl groups and are prepared by a special process. Photosensitive, photopolymerizable and crosslinkable recording materials for optical information fixing are based on these oligomeric resins, and lithographic printing plates are produced by a process in which the novel photosensitive recording materials are used.

8 Claims, No Drawings

CROSSLINKABLE RESIN, PHOTOSENSITIVE RECORDING MATERIAL BASED ON THIS CROSSLINKABLE RESIN, AND PRODUCTION OF A LITHOGRAPHIC PRINTING PLATE USING THIS PHOTOSENSITIVE RECORDING MATERIAL

The present invention relates to crosslinkable, oligomeric resins which are free of urethane groups, contain (meth)acryloyl groups and free carboxyl groups and are soluble or dispersible in aqueous alkaline media, and to photosensitive, photopolymerizable compositions or recording materials, for example for the production of protective layers and coatings and in particular for use in optical information fixing, which contain such a crosslinkable, oligomeric resin. The present invention furthermore relates to a process for the production of lithographic printing plates using the photosensitive, photopolymerizable recording materials under discussion, the said process being capable of being carried out using purely aqueous alkaline developers.

Photosensitive, photopolymerizable recording materials which can be washed out with aqueous alkaline developers and are used for the production of, for example, imagewise structured protective layers and coatings and photopolymer printing plates, in particular lithographic printing plates, are known. They generally contain a photopolymerizable recording layer on a dimensionally stable base, for example a plastic film or a metal substrate, such as an aluminum sheet, the said recording layer consisting of a mixture of one or more polymeric binders which are soluble or dispersible in aqueous alkaline media, one or more ethylenically unsaturated, photopolymerizable monomers, one or more photoinitiators and, if required, further additives and/or assistants. In particular, carboxyl-containing or carboxylic anhydride-containing polymers, such as alkyl (meth)acrylate/(meth)acrylic acid copolymers, styrene/maleic anhydride copolymers or styrene/maleic half ester copolymers (U.S. Pat. Nos. 3,547,651; 3,751,259; 3,804,631 and Great Britain Pat. No. 1,361,298), have been suggested as polymeric binders for the photopolymerizable recording layers which can be developed with aqueous alkaline media.

As a rule, these known photopolymerizable recording materials which can be developed with aqueous alkaline media require very long exposure times, for example for the fine image elements regarded as standard in offset printing (for example screen of 60 L/cm, less than 2% tonal values) to be reproduced correctly and permanently anchored to the base. Frequently, the resolving power of these recording materials is also unsatisfactory, and the high sensitivity to oxygen necessitates a protective and barrier layer on the photopolymerizable recording layer. Another disadvantage is the sensitivity of the photopolymerized layers to Cthe washout medium, i.e. the sensitivity to over-washing is high, and the resistance of the photopolymerized layers to aqueous and organic solvents and other chemicals with which these layers come into contact during their use is also unsatisfactory.

U.S. Pat. No. 4,234,67 describes a dry film resist which can be developed with a purely aqueous alkaline medium and at the same time is said to possess good chemical stability in the exposed state. The photopolymerizable layer of the dry film resist contains carboxyl-containing, water-insoluble copolymer as a binder, a polar oligomer obtained by an addition reaction of an unsaturated mono- or dicarboxylic acid, e.g. (meth)acrylic acid, maleic acid or fumaric acid, with an epoxy resin, and a polyfunctional (meth)acrylate monomer. The weight ratio of the polymeric binder to the oligomers to the monomers in the photopolymerizable layer is 1:0.15 - 1:0.15 - 1. These photopolymerizable recording materials too possess unsatisfactory performance characteristics.

Great Britain Pat. No. 1,489,425 and U.S. Pat. No. 4,162,274 describe photocurable compositions which can be developed with aqueous alkaline media and contain a photopolymerizable and crosslinkable oligomeric resin containing acryloyl and/or methacryloyl groups and free carboxyl groups. These photocurable compositions exhibit good adhesion to metallic bases, cure comparatively rapidly and are insensitive to oxygen. These known materials too are not completely satisfactory when used in optical information fixing, such as the production of resist layers and in particular of lithographic printing plates. For example, many of the photosensitive compositions described in this publication are tacky and therefore have to be provided with a protective film and cover sheet. In particular, the imagewise structured layers produced from these photocurable recording materials, for example the lithographic printing plates produced from the said materials, are in many cases not sufficiently resistant to chemicals and aqueous and organic solvents with which they come into contact during their use.

It is an object of the present invention to provide a novel, photopolymerizable and crosslinkable resin which can advantageously be used in photosensitive recording materials which can be developed in aqueous alkaline media and are used for the production of thin protective layers and coatings and in particular of very stable high quality lithographic printing plates. It is a further object of the present invention to provide a process for the production of lithographic printing plates using photopolymerizable recording materials which can be developed with aqueous alkaline media, the said process being capable of being carried out simply and rapidly and giving durable and stable lithographic printing plates which provide exact reproduction of image and tonal value.

We have found that these objects are achieved by photosensitive, photopolymerizable compositions which contain, as the photopolymerizable component, a crosslinkable, oligomeric resin of the type described in detail below, which is soluble or dispersible in aqueous alkaline solutions, is free of urethane groups and contains acryloyl and/or methacryloyl groups and free carboxyl groups.

The present invention accordingly relates to a photopolymerizable and crosslinkable, oligomeric resin which is soluble or dispersible in aqueous alkaline solutions, contains acryloyl and/or methacryloyl groups and free carboxyl groups, and has a mean molecular weight (number average) of from about 1,000 to 10,000 and an acid number of from 50 to 150 mg of KOH per g, as obtainable by reacting a diol or polyol compound containing one or more (meth)acryloyl groups with polyfunctional carboxylic acids or their derivatives, in particular cyclic carboxylic anhydrides, with formation of acid partial esters of the carboxylic acids or carboxylic acid derivatives, and then subjecting some of the free carboxyl groups of the resulting reaction product to a chain-extending reaction with a diepoxide and/or a polyepoxide.

The present invention furthermore relates to a photosensitive recording material consisting of a homogeneous mixture which is soluble or dispersible in aqueous alkaline solutions and contains one or more photopolymerization initiators and one or more photopolymerizable and crosslinkable oligomeric resins which contain acryloyl and/or methacryloyl groups and free carboxyl groups and have a mean molecular weight (number average) of from about 1,000 to 10,000 and an acid number of from 50 to 150 mg of KOH per g, and, if required, further additives and/or assistants, the said recording material containing, as the photopolymerizable and crosslinkable resin, an oligomeric resin which is soluble or dispersible in the aqueous alkaline solutions and is obtainable by reacting a diol or polyol compound containing one or more (meth)acryloyl groups with polyfunctional carboxylic acids or their derivatives, in particular cyclic carboxylic anhydrides, with formation of acidic partial esters of the carboxylic acids or carboxylic acid derivatives, and then subjecting some of the free carboxyl groups of the resulting reaction product to a chain-extending reaction with a diepoxide and/or a polyepoxide.

The present invention furthermore relates to a process for the production of a lithographic printing plate, in which a photosensitive recording element comprising a base, which is typical for lithographic printing plates and has a hydrophilic surface, and, applied on this, a photopolymerizable recording layer about 0.5 to 6 μm thick is exposed imagewise to actinic light and the unexposed parts of the recording layer are then removed by means of an aqueous alkaline developer, the said recording layer containing one or more photopolymerization initiators and, as the principal component, one or more photopolymerizable, crosslinkable, oligomeric resins containing acryloyl and/or methacryloyl groups and free carboxyl groups, and, if required, further additives and/or assistants. In the process according to the invention, the photopolymerizable recording layer of the photosensitive recording element is built from a homogeneous mixture of not less than 60% by weight, based on the photopolymerizable recording layer, of one or more photopolymerizable and crosslinkable, oligomeric resins which are soluble or dispersible in the aqueous alkaline developers and have a mean molecular weight (number average) of from about 1,000 to 10,000 and an acid number of from 50 to 150 mg of KOH per g, from 0.001 to 10% by weight, based on the photopolymerizable recording layer, of one or more photopolymerization initiators and from 0 to 39.9% by weight, based on the photopolymerizable recording layer, of further additives and/or assistants, and this mixture contains photopolymerizable and crosslinkable, oligomeric resins as can be obtained by reacting a diol or polyol compound containing one or more (meth)acryloyl groups with polyfunctional carboxylic acids or their derivatives, in particular cyclic carboxylic anhydrides, with formation of acidic partial esters of the carboxylic acids or carboxylic acid derivatives, and then subjecting some of the free carboxyl groups of the resulting reaction product to a chain-extending reaction with a diepoxide and/or a polyepoxide.

The novel resins which can be crosslinked by polymerization are oligomers, ie. compounds which contain not less than 2, preferably more than 2, repeating structural units in a molecule. The mean molecular weight (number average) of the oligomeric resins is from about 1,000 to 10,000, preferably from about 1,500 to 6,000. Preferred novel oligomeric resins are solid at room temperature. The said resins should be capable of being crosslinked by polymerization, in particular by polymerization in the presence of a photoinitiator, and in general accordingly contain on average not less than 2, preferably more than 2, acryloyl and/or methacryloyl groups incorporated in the molecule. The average content of acrylic and/or methacrylic double bonds in the novel oligomeric resins advantageously corresponds to about 2.1–8, in particular about 2.5–6, acryloyl and/or methacryloyl groups per molecule of the said resin. The latter should be soluble or dispersible in aqueous alkaline solutions, as employed in particular for the development of imagewise exposed, photopolymerizable recording materials, and, regarding their processability, are advantageously also soluble in organic solvents, such as ketones, esters, lower alkanols or the like. The solubility or dispersibility of the novel crosslinkable oligomeric resins is essentially determined by their content of free carboxyl groups. The said resins therefore contain free carboxyl groups in an amount such that their acid number is from about 50 to 150, preferably from 60 to 120, mg of KOH per g.

The novel, photopolymerizable and crosslinkable oligomeric resins are urethane-free resins as can be, and are, obtained by reacting a diol or polyol compound containing one or more acryloyl and/or methacryloyl groups with polyfunctional carboxylic acids or their derivatives, in particular cyclic carboxylic anhydrides, with formation of acidic partial esters of the carboxylic acids or carboxylic acid derivatives, and then subjecting some of the free carboxyl groups of the resulting reaction product to a chain-extending reaction with a diepoxide and/or a polyepoxide.

Suitable starting compounds for the preparation of the novel oligomeric resins which can be crosslinked by polymerization are in principle any urethane-free diols or polyols which contain one or more acryloyl and/or methacryloyl groups incorporated in the molecule. Diols and/or polyols of this type which have proven particularly advantageous for this purpose are those obtained by reacting acrylic acid and/or methacrylic acid with a diepoxide or a polyepoxide or with an OH-containing monoepoxide. In the reaction of the (meth)acrylic acid with the epoxide compounds, the glycidyl groups of the latter are converted to $\beta$-hydroxy(meth)acrylate groups. Thus, reaction of hydroxyl-containing monoepoxides with acrylic acid and/or methacrylic acid gives diol of polyol compounds which contain one acryloyl or one methacryloyl group. An example of an OH-containing epoxide is glycidol. Accordingly, in the reaction of di- or polyepoxide with acrylic acid and/or methacrylic acid, diols or polyols containing two or more acryloyl and/or methacryloyl groups are formed. Suitable di- and polyepoxides are compounds possessing two or more glycidyl groups, such as di- or polyglycidyl ethers of polyhydric alcohols and in particular of polyhydric phenols, and di- or polyglycidyl esters of polybasic aliphatic, cycloaliphatic and in particular aromatic carboxylic acids. Particularly preferred diepoxides and/or polyepoxides for the preparation of the diol or polyol compounds containing acryloyl and/or methacryloyl groups are those in which the glycidyl groups are bonded directly or indirectly to unsubstituted or substituted mononuclear or polynuclear aromatic ring systems. Examples of suitable and advantageous glycidyl ethers are the reaction products of epichlorohydrin with bisphenol A or with derivatives or substitution products of bisphenol A. Suitable glycidyl esters include diglycidyl phthalate, diglycidyl isophthalate, diglycidyl tereohthalate and diglycidyl hexahydrophthalate. The stated di- and polyepoxides may furthermore be subjected, before or during the reaction with the acrylic acid and/or methacrylic acid, to a chain-extending reaction with aliphatic or aromatic dicarboxylic acids or with aliphatic or aromatic dicarboxylic acid derivatives which are reactive toward glycidyl groups. Examples of compounds which are suitable for this purpose are phthalic acid, isophthalic acid, terephthalic acid, hexahydrophthalic acid, malonic acid, succinic acid, methylsuccinic acid, adipic acid and those derivatives of these acids which are reactive toward glycidyl groups. Phthalic acid and adipic acid and their derivatives are preferred. The di- and/or polyepoxides, which may or may not have been subjected to a preliminary chain-extending reaction, are reacted with the acrylic acid and/or methacrylic acid in a ratio such that at least a predominant amount of glycidyl groups is converted to $\beta$-hydroxy(meth)acrylate groups with the (meth)acrylic acid. Accordingly, the ratio of the number of equivalents of glycidyl groups to that of COOH groups in this reaction is preferably from 1:0.5 to about 1:1, in particular about 1:1. If the said preliminary chain-extending reaction is carried out simultaneously with the reaction of the di- or polyepoxides with the acrylic acid and/or methacrylic acid, i.e. if the di- or polyepoxides are reacted with a mixture of a dicarboxylic acid or dicarboxylic acid derivative of the stated type and acrylic and/or methacrylic acid, the ratio of the number of equivalents of glycidyl groups to the total number of equivalents of COOH groups is likewise preferably about 1:1; in this case, the amount of dicarboxylic acids or dicarboxylic acid derivatives and that of acrylic acid and/or methacrylic acid in the said mixture are each from about 30 to 70 mol %, based on the mixture of the carboxylic acids under discussion or derivatives of these.

Examples of diol and polyol compounds which contain acryloyl and/or methacryloyl groups and have proven advantageous for the preparation of the novel oligomeric resins which can crosslinked by polymerization are those prepared by reacting bisphenol A diglycidyl ethers, in particular the diglycidyl ether obtained from bisphenol A and epichlorohydrin, with acrylic acid in an amount such that the ratio of the number of equivalents of glycidyl groups to that of COOH groups is about 1:1, or by reacting bisphenol A diglycidyl ethers, in particular the diglycidyl ether obtained by reaction of epichlorohydrin with bisphenol A, with a mixture of adipic acid and acrylic acid in an amount such that the ratio of the number of equivalents of glycidyl groups to the number of equivalents of COOH groups of the adipic acid to the number of equivalents of COOH groups of the acrylic acid is 1:0.4-0.6:0.4-0.6 and the ratio of the number of equivalents of glycidyl groups to the total number of equivalents of COOH groups is about 1:1.

To introduce free carboxyl groups, these diol or polyol compounds containing acryloyl and/or methacryloyl groups are reacted with polybasic carboxylic acids or their derivatives, in particular cyclic carboxylic anhydrides, preferably with dicarboxylic acids or their derivatives, especially cyclic dicarboxylic anhydrides, so that the hydroxyl groups of diol or polyol compounds react with the polybasic carboxylic acids or their derivatives with formation of acidic partial esters of these carboxylic acids. If the said diol or polyol compounds also contain glycidyl groups by virtue of their preparation, these groups too are reacted with the polybasic carboxylic acids or their derivatives. Preferably, the reaction is carried out so that all hydroxyl groups and any glycidyl groups still present in the diol or polyol compound are reacted with the polybasic carboxylic acids or their derivatives with formation of the acidic partial esters. Polybasic carboxylic acids and derivatives of these which are particularly suitable for this reaction are dicarboxylic acids and cyclic anhydrides of di-, tri- and tetracarboxylic acids, e.g. phthalic acid, isophthalic acid, terephthalic acid, trimellitic acid, hexahydrophthalic acid, malonic acid, succinic acid, adipic acid, etc., and their anhydrides, preferably the cyclic anhydrides of these carboxylic acids. The polybasic aromatic carboxylic acids and in particular their cyclic anhydrides, e.g. phthalic anhydride, or mixtures of phthalic anhydride with other polybasic carboxylic acids or carboxylic anhydrides, in particular mixtures of phthalic anhydride with trimellitic anhydride, have proven particularly advantageous here. The mixtures of phthalic anhydride with the other polybasic carboxylic acids or carboxylic anhydrides preferably contain from about 65 to 95, in particular from 75 to 90, mol % of phthalic anhydride and from about 5 to 35, in particular from 10 to 25, mol % of the other polybasic carboxylic acids or carboxylic anhydrides. In the reaction of the diol and/or polyol compounds containing the acryloyl and/or methacryloyl groups with the cyclic carboxylic anhydrides, the ratio of the number of equivalents of OH groups to that of anhydride groups is preferably from about 1:0.8 to 1:1.2.

Some of the free carboxyl groups formed in the partial esterification of the polybasic carboxytic acids and the polybasic carboxylic acid derivatives with the said diol and/or polyol compounds are then reacted with diepoxides and/or polyepoxides, with chain extension and, if required, branching, to give the oligomeric resins. Suitable diepoxides and polyepoxides for chain extension and, where relevant, branching are in principle any compounds containing two or more glycidyl groups, for example the reaction products of epichlorohydrin with diols or polyols, the reaction products of epichlorohydrin with diamines or polyamines, polyolefin epoxides, epoxy resins of the novolak type and glycidyl esters of di- or polycarboxylic acids. For example, suitable compounds are di- or polyglycidyl ethers of aliphatic diols or polyols, for example those of butanediol, glycerol, trimethylolpropane, pentaerythritol or polyethylene glycols, di- or polyglycidyl ethers of mononuclear or polynuclear aromatic di- or polyhydroxy compounds, for example those of polyhydric phenols, and furthermore the di- or polyglycidyl esters of aliphatic, cycloaliphatic or aromatic di- or polycarboxylic acids, for example those of adipic acid, hexahydrophthalic acid, phthalic acid, isophthalic acid or terephthalic acid. The di- and polyglycidyl ethers of aliphatic di- and polyols, e.g. pentaerythritol triglycidyl ether, and the diglycidyl ethers of bisphenol A or the substitution products of bisphenol A, for example the diglycidyl ether obtained by reacting epichlorohydrin with bisphenol A, have proven particularly advantageous here. When the free carboxyl groups of the reaction product produced beforehand are subjected to a chain-extending reaction with the di- and/or polyepoxides, the ratio of the number of equivalents of COOH groups to that of glycidyl groups is greater than 1:1, preferably from about 1:0.8 to 1:0.2, in particular from about 1:0.6 to about 1:0.25.

The novel oligomeric resins which can be crosslinked by polymerization may be prepared by a conventional procedure for polycondensation or polyaddition reactions in the absence of a solvent or, advantageously, in solution, and in the presence or absence of a suitable catalyst. In order that the oligomeric resins are readily processable, the reactions are preferably carried out so that the resulting oligomeric resins are soluble in organic solvents.

Novel oligomeric resins which have proven particularly advantageous are those obtained as follows: Reaction of the diglycidyl ether, obtained by reacting epichlorohydrin with bisphenol A, with (meth)acrylic acid or with a mixture of (meth)acrylic acid and a dicarboxylic acid, in particular adipic acid or phthalic acid, in amounts such that the ratio of the number of equivalents of glycidyl groups to the total number of equivalents of COOH groups is about 1:1, the ratio of (meth)acrylic acid to the dicarboxylic acid being in the range stated above when carboxylic acid mixtures are used, reaction of the hydroxyl groups of the resulting reaction product with phthalic anhydride or a mixture of a predominant amount of phthalic anhydride and a minor amount of trimellitic anhydride so that the ratio of the number of equivalents of OH groups to that of anhydride groups is about 1:1, with formation of the acidic partial esters of phthalic acid and of any trimellitic acid used, and subsequent reaction of some of the free carboxyl groups of the resulting reaction product with a di- or triglycidyl ether, in particular the diglycidyl ether of epichlorohydrin and bisphenol A or, for example, pentaerythritol triglycidyl ether, in amounts such that the ratio of the number of equivalents of COOH groups to that of glycidyl groups is about 2:1 to 4:1.

The novel crosslinkable oligomeric resins are suitable, for example, for the preparation of photosensitive, photopolymerizable compositions quite generally, as employed, inter alia, for the production of coatings and the like. Because of their particularly advantageous properties, the said resins are particularly useful for the production of photosensitive, photopolymerizable recording materials which can be developed with aqueous alkaline media, such recording materials being used, for example, for the production of imagewise structured protective layers and coatings and in particular for the production of lithographic printing plates. The photosensitive recording materials based on the novel crosslinkable oligomeric resins not only exhibit good adhesion to metallic bases both in the unexposed and in the exposed state, but also possess high photoreactivity and are comparatively insensitive to oxygen. Compared with known photosensitive, photopolymerizable recording materials based on crosslinkable oligomeric resins having a similar composition. The photosensitive recording materials according to the invention are, surprisingly in particular, less tacky, so that photosensitive recording elements based on these resins can be used without a cover sheet on the photopolymerizable recording layer. Apart from the good exposure and development properties of the photopolymerizable recording materials prepared using the novel crosslinkable oligomeric resins, the good resistance of the imagewise structured photopolymer coatings and protective layers and lithographic printing plates produced with these recording materials, in particular to aqueous and organic solvents or other chemicals with which these coatings and protective layers or lithographic printing plates come into contact during their use, was unexpected.

The photosensitive, photopolymerizable compositions, including the photosensitive, photopolymerizable recording materials based on the novel crosslinkable oligomeric resins contain, as a homogeneous mixture with the said resins, one or more photopolymerization initiators and, if required, further additives and/or assistants, the additives being photopolymerizable and/or non-photopolymerizable. In these photopolymerizable compositions, the said resins may be employed alone or as a mixture with one another. The said recording materials should furthermore be soluble or dispersible in aqueous alkaline solutions and in general are used by being applied in the form of a thin photopolymerizable, crosslinkable layer on a suitable, dimensionally stable base. Moreover, in the photosensitive recording materials, the individual components are matched up with one another so that they are compatible and produce no significant light scattering, if any at all, during imagewise exposure of the recording materials.

Suitable photopolymerization initiators for the novel photopolymerizable, crosslinkable compositions or recording materials are the photoinitiators and photoinitiator systems conventionally used for such compositions and photosensitive recording materials. These include benzoin and benzoin derivatives, such as benzoin ethers, substituted benzoins and substituted benzoin derivatives, for example substituted benzoin ethers, benzils, in particular benzil ketals, e.g. benzil dimethyl ketal, benzil methyl ethyl ketal or benzil methyl benzyl ketal, and the benzoyldiarylphosphine oxides which are known, effective photoinitiators, e.g. 2,4,6-trimethylbenzoyldiphenylphosphine oxide. Particularly advantageous photoinitiators, in particular for thin photosensitive, photopolymerizable recording layers, as employed, for example, for the production of resist images and lithographic printing plates, include compounds of the benzophenone type and their derivatives, e.g. benzophenone, 4,4'-dimethylaminobenzophenone, 4,4'-diethylaminobenzophenone, derivatives of Michler's ketone, 4,4'-dichlorobenzophenone, etc., and their mixtures, in particular mixtures of benzophenone and Michler's ketone; hexaarylbisimidazoles, e.g. 2,2'-o-chlorophenyl-4,4',5,5'-p-methoxyphenylbisimidazole, and mixtures of hexaarylbisimidazoles with sensitizers, such as 2-mercaptobenzoquinazole; unsubstituted or substituted polynuclear quinones, such as anthraquinone, benzanthraquinone, 2-ethylanthraquinone or tert.-butylanthraquinone; 2-chlorothioxanthone and the acridine or phenazine derivatives which are effective photoinitiators. Typical examples of photoinitiator systems are combinations of benzophenone or benzophenone derivatives with tertiary amines, such as triethanolamine or Michler's ketone, and mixtures of hexaarylbisimidazoles and the leuco bases of triphenylmethane dyes, e.g. leuco crystal violet, leuco malachite green or tris-(4-diethylamino-2-methylphenyl)methane. The photoinitiators or photoinitiator systems are adequately described in the relevant literature, and their range is familiar to the skilled worker. The photoinitiators or photoinitiator systems can be used in the novel photopolymerizable crosslinkable compositions or recording materials alone or as a mixture with one another.

In addition to the novel crosslinkable oligomeric resins and the photoinitiators, photosensitive, photopolymerizable and crosslinkable compositions or recording materials according to the invention can contain effective amounts of further additives and/or assistants.

For example, in addition to the said resins and the photoinitiators, one or more ethylenically unsaturated, photopolymerizable monomers may also be present. In particular, the exposure properties of the said compositions or recording materials can be varied by adding such photopolymerizable monomers, and it is possible in general to employ shorter exposure times when monomers are added. The said monomers may be monofunctional or polyfunctional, i.e. they can possess one or more photopolymerizable double bonds. Preferably, bifunctional or polyfunctional ethylenically unsaturated, photopolymerizable monomers, alone, as a mixture with one another or as a mixture with monofunctional ethylenically unsaturated, photopolymerizable monomers, are employed for the novel photopolymerizable and crosslinkable compositions or recording materials. These monomers, which usually have a boiling point above 100° C. under atmospheric pressure and a molecular weight of in general less than 1,000, should be compatible with the novel crosslinkable, oligomeric resins in the photosensitive recording materials. Preferably used monomers are those which have a terminal vinyl or vinylidene double bond, and in particular those in which the photopolymerizable double bond or bonds is or are activated by conjugation or by being adjacent to O, N or S atoms.

Typical examples of the ethylenically unsaturated, photopolymerizable monomers, in addition to the allyl compounds, e.g. allyl acrylate and diallyl phthalate, and vinyl compounds, e.g. the N-vinyllactams, in particular N-vinylpyrrolidone and N-vinylcaprolactam, are the monomers which contain acryloyl and/or methacryloyl groups. These include, in particular, the esters of acrylic acid and methacrylic acid, e.g. the di- and tri-(meth)acrylates of ethylene glycol, diethylene glycol, triethylene glycol or polyethylene glycols having a molecular weight as high as about 500, propane-1,2-diol, propane-1,3-diol, propylene glycols having a molecular weight as high as about 500, butane-1,4-diol, 1,1,1-trimethylolpropane, 2,2-dimethylpropanediol, glycerol or pentaerythritol; pentaerythritol tetra(meth)acrylate, glucose tetra(meth)acrylate; urethane acrylates and methacrylates possessing two or more acryloyl or methacryloyl groups, as can be prepared, for example, by reacting an aliphatic diol or polyol of the above type with an organic diisocyanate, e.g. hexamethylene diisocyanate, in amounts such that the ratio of the number of equivalents of OH to that of NCO is about 1:2, and then reacting the free isocyanate groups of the resulting reaction product with monohydroxy (meth)acrylates, in particular monohydroxyalkyl (meth)acrylates; monomers possessing two or more acryloyl or methacryloyl groups, as formed by reacting acrylic acid and/or methacrylic acid with di- and polyglycidyl compounds, in particular di- or polyglycidyl ethers, for example the reaction product of two moles of acrylic acid and/or methacrylic acid with one mole of bisphenol A bisglycidyl ether. Examples of monofunctional monomers are the monoacrylates and monomethacrytates of monoalkanols, in particular those of 1 to 20 carbon atoms, or the mono(meth)acrylates of the above diols and polyols. Particularly preferred monomers include trimethylolpropane triacrylate, trimethylolpropane trimethacrylate, pentaerythritol triacrylate and tetraacrylate, and pentaerythritol trimethacrylate and tetramethacrylate.

Suitable further additives and/or assistants, which may be present in the novel photosensitive, photopolymerizable and crosslinkable compositions or recording materials together with the novel, crosslinkable oligomeric resins, the photopolymerization initiators and, if required, the photopolymerizable monomers, are both non-polymerizable additives and/or assistants which influence the exposure properties and/or polymerization properties, for example dyes, pigments, sensitometric regulators, thermal polymerization inhibitors and the like, and additives which improve or modify the mechanical properties, e.g. plasticizers, fillers, leveling agents, polymeric binders, etc. The conventional compounds described for this purpose in the relevant literature are suitable as the said further additives and/or assistants. Examples of dyes and/or pigments, which may act as contrasting agents as well as strengthening the layer, are described, inter alia, in U.S. Pat. Nos. 3,218,167 and 3,884,693. These include, for example, Victoria Sky Blue FGA, Victoria Sky Blue BO (C.I. 42,595), Malachite Green, Crystal Violet, Victoria Blue B (C.I. 44,045), rhodamine 6 G (C.I. 45,160) and others. The image contrast of the imagewise exposure can be increased by using, for example, dyes such as methanil yellow (C.I. 13,065), methyl orange (C.I. 13,025) or phenylazodiphenylamine, as well as the leuco bases of the triarylmethane dyes, e.g. Malachite Green leuco base, Crystal Violet leuco base or rhodamine B base. Suitable thermal polymerization inhibitors include hydroquinone, hydroquinone derivatives, 2,6-di-tert.-butyl-p-cresol, nitrophenols, and N-nitroamines, such as N-nitrosodiphenylamine or the salts of N-nitrosocyclohexylhydroxylamine. Sensitometric regulators for the recording materials include compounds such as 9-nitroanthracene, 10,10'-bisanthrones, and phenazinium, phenoxazinium, acridinium and phenothiazinium dyes, in particular in combination with mild reducing agents, 1,3-dinitrobenzenes and the like. Any plasticizers, leveling agents and/or polymeric binders present in the photosensitive, photopolymerizable and crosslinkable recording materials should be compatible with the other components of the said recording materials, in particular the novel, crosslinkable oligomeric resins and any ethylenically unsaturated, photopolymerizable monomers used. Particularly advantageous polymeric binders for the novel photosensitive recording materials which can be developed with aqueous alkaline media are those which are insoluble in water but soluble or dispersible in aqueous alkaline solutions; particularly suitable binders for this purpose are therefore compatible polymeric binders which contain free acidic groups or carboxylic anhydride groups, in particular free carboxyl groups and/or carboxylic anhydride groups. Examples of suitable and very advantageous polymeric binders are N-vinylamide copolymers containing free carboxyl groups, for example the copolymers which are insoluble in water but soluble or dispersible in aqueous alkaline solutions and consist of from 10 to 50, preferably from 20 to 45, % by weight of N-vinylpyrrolidone and/or N-vinylcaprolactam, from 5 to 30, preferably from 5 to 15, % by weight of acrylic acid and/or methacrylic acid and from 30 to 80, in particular from 40 to 70, % by weight of one or more hydrophobic comonomers, such as styrene and/or alkyl (meth)acrylates, e.g. methyl methacrylate, or vinyl acetate, the stated percentages being based in each case on copolymer.

The novel photopolymerizable, crosslinkable compositions and recording materials contain in general from 0.001 to 10, in particular from 0.1 to 5, % by weight of photopolymerization initiators. The type and amount of any additives and/or assistants present in addition to the novel, crosslinkable oligomeric resins and photoinitiators can be varied within wide limits and essentially depend on the desired spectrum of properties and in particular on the intended use of the said compositions and recording materials. In general, however, the amount of the said resins should not be less than 5, preferably not less than 20, % by weight, based on the total photopolymerizable, crosslinkable mixture of the compositions or recording material. Usually, the said resin or resins constitute the component present in the largest amount in the novel photopolymerizable and crosslinkable compositions or recording materials. The said compositions and recording materials are particularly useful for the production of relatively thin protective layers and coatings, preferably those having a thickness of less than 100 μm.

In a particularly advantageous, preferred embodiment, particularly for the production of lithographic printing plates, the novel photosensitive recording materials consist of a homogeneous mixture which is soluble or dispersible in aqueous alkaline solutions and comprises not less than 60, preferably not less than 65, % by weight, based on the photosensitive recording material, of one or more novel, crosslinkable, oligomeric resins, from 0.001 to 10, preferably from 0.1 to 5, % by weight, based on the photosensitive recording material, of one or more photopolymerization initiators and a total of 0 to 39.9 % by weight, based on the photosensitive recording material, of further photopolymerizable and non-photopolymerizable additives and/or assistants in effective amounts. If these preferred photosensitive recording materials contain such further additives and/or assistants, the amount of the latter is usually not less than 0.01 % by weight, based on the photosensitive recording material; preferably, the total amount of additives and/or assistants present in the photosensitive recording material in addition to the said resins and the photopolymerization initiators is not more than 29.9 % by weight, based on the photosensitive recording material. The upper limit for the content of the said resins in these preferred photosensitive recording materials is determined by the amount of photopolymerization initiator employed and the amounts of any additives and/or assistants also present. Preferably, these photosensitive recording materials contain not more than 99, in particular not more than 95, % by weight, based on the photosensitive recording material, of the novel crosslinkable oligomeric resins. Ethylenically unsaturated, photopolymerizable monomers are present in the preferred novel photosensitive recording materials in amounts of from 0 to 25 % by weight, based on the photosensitive recording material, the amount of these monomers, where they are used, preferably being not less than 3% by weight, based on the photosensitive recording material. Advantageously, the said preferred recording materials contain from 0.01 to about 8% by weight, based on the photosensitive recording material, of non-polymerizable assistants which influence the exposure properties and/or polymerization properties. Where additives which improve and/or modify the mechanical properties of the recording materials, in particular polymeric binders, are used, they are preferably present in an amount of from 1 to 20% by weight, based on the photosensitive recording material. However, a particular advantage of these preferred photosensitive recording materials is the fact that the use of these last-mentioned additives, in particular polymeric binders, may be dispensed with.

The novel photopolymerizable and crosslinkable compositions and recording materials can be prepared in a conventional manner by mixing the individual components of these compositions or recording materials to give a homogeneous mixture. Mixing can be carried out, for example, mechanically in kneaders, mixers, estruders or the like, or advantageously in solution, by dissolving the components of the said compositions or recording materials in a suitable solvent or solvent mixture. Examples of suitable solvents are lower alkanols, ketones and esters, e.g. methanol, acetone, methyl ethyl ketone or ethyl acetate, or mixtures of these. To use the photosensitive recording materials, for example for the production of imagewise structured protective layers or coatings and in particular for the production of lithographic printing plates, the said recording materials are generally applied in the form of a thin photosensitive, photopolymerizable and crosslinkable recording layer on a suitable, dimensionally stable base.

Suitable dimensionally stable bases are the dimensionally stable, rigid or, preferably, flexible bases conventionally used for photosensitive recording materials, the intended use of the latter being one of the factors which determine the type of base in a known manner. Examples of dimensionally stable bases include plastic films and sheets, e.g. polyester films, metallic bases, for example those of magnesium, zinc, copper or aluminum, and metal-coated substrates, for example metallized plastic sheets or copper-clad bases. Bases possessing a metallic or metal-oxide surface are preferably used for the novel photosensitive recording materials. To produce imagewise structured protective layers and coatings, the novel photosensitive, photopolymerizable and crosslinkable recording material can be applied directly onto the substrate to be protected and, if appropriate, permanently modified, this substrate constituting the base. For the production of lithographic printing plates, metallic bases, in particular aluminum sheets, are preferably used, the surface of these bases advantageously being pretreated mechanically, chemically and/or electrochemically. Bases which are particularly advantageously used for the production of lithographic printing plates are aluminum sheets which, for this purpose, are mechanically, chemically or electrochemically roughened on the surface in a conventional manner and/or are anodically oxidized after the roughening procedure, where this is carried out. Further aftertreatment of these roughened and/or anodized aluminum sheets, for example with hot water or steam, polyvinyl-phosphonic acid, an alkali metal silicate, a phosphate, a hexafluorozirconate, a chromate, a borate, a polyacryl amide or a cellulose derivative, may be advantageous. The dimensionally stable bases for the photosensitive recording materials are usually from about 0.03 to about 0.3 mm thick.

The photosensitive, photopolymerizable and crosslinkable recording materials are advantageously applied as a layer of the desired thickness to the dimensionally stable base from solution, by casting, dipping, spraying or another conventional method of application. For lithographic printing plates, the dry layer of the photosensitive recording material applied on the base is in general from 0.5 to 6 μm thick.

Since the novel photosensitive, photopolymerizable and crosslinkable recording materials are comparatively insensitive to oxygen, a separate cover sheet or oxygen barrier layer on the photosensitive, photopolymerizable and crosslinkable recording layer according to the invention can be dispensed with, which is particularly advantageous. However, it is of course also possible to provide such a cover sheet on the said recording layer, cover sheets of polyvinyl alcohol or polyvinyl alcohol derivatives having proven particularly advantageous for this purpose.

To effect imagewise structuring, for example for the production of lithographic printing plates, the novel photosensitive recording material applied as a layer on the dimensionally stable base is first exposed imagewise to actinic light. This imagewise exposure may be carried out, for example, using diffuse acting light, through a photographic transparency, for example a photographic negative or positive, or using an imagewise modulated light beam, for example an imagewise modulated laser beam. Light sources which are suitable for the imagewise exposure of the novel photosensitive recording materials are the conventional sources of actinic light, for example UV fluorescence tubes, high pressure, medium pressure or low pressure mercury lamps, superactinic fluorescent tubes, pulsed xenon lamps, metal halide-doped lamps, carbon arc lamps, etc., as well as UV laser, argon lasers and the like. The wavelength of the light emitted by the light source should be in general from 230 to 450 nm, preferably from 300 to 420 nm, and in particular should be matched with the intrinsic absorption of the photoinitiator used. Imagewise exposure of the said recording materials to the actinic light initiates in the exposed parts of the recording layer a photopolymerization reaction which leads to crosslinking in these parts and hence to a differentiation between the solubilities of the exposed and unexposed parts of the layer. After imagewise exposure, the unexposed, non-crosslinked parts of the layer of the photosensitive recording material are washed out with an aqueous alkaline developer, and the image structure, for example the lithographic printing plate, developed in this way. Development can be effected by spraying, washing, rubbing, brushing, etc. with the developer. Particularly suitable developers are aqueous alkaline solutions which, in order to establish the most advantageous pH, which is in general from 8 to 14, preferably from 9 to 13, contain alkaline substances, e.g. borax, disodium hydrogen phosphate, sodium carbonate, an alkali metal hydroxide or an organic base, such as di- or triethanolamine, dissolved in water. A typical and advantageous developer is a 1% strength by weight solution of sodium carbonate in water. The aqueous alkaline developers may furthermore contain buffer salts, for example water-soluble alkali metal phosphates, silicates, borates, acetates or benzoates. Wetting agents, preferably onionic wetting agents, and, if required, soluble polymers, e.g. sodium carboxymethylcellulose, polyvinyl alcohol, polysodium acrylate and the like, may be concomitantly used as further components of the developers. Although the novel photosensitive recording materials can be washed out with purely aqueous alkaline developers, it is however also possible for small amounts of an organic solvent, for example a lower alkanol, acetone or tetrahydrofuran, to be added to the said developers.

In the production of lithographic printing plates, the latter are generally freed from residual developer after the development procedure and are dried, if necessary at up to 120° C. In some cases, it is advantageous if the resulting lithographic printing plate is subsequently exposed uniformly to actinic light in order to increase its strength. The lithographic printing plate thus obtained may furthermore be after-treated in a conventional manner and further prepared for offset printing, for example by hydrophilization or gumming of the hydrophilic surface, or, where there is a prolonged period of storage between production of the lithographic printing plate and its use on the printing press, preserving the said plate until required for printing.

The novel photosensitive, photopolymerizable compositions and recording materials containing the special novel, crosslinkable, oligomeric resins exhibit not only good adhesion to metallic bases, both in the unexposed and in the exposed state, but in particular good exposure properties, high photoreactivity and, after the imagewise exposure, good washout behavior in aqueous alkaline developers, without being sensitive to overwashing. In spite of short exposure and development times, very good differentiation between exposed and unexposed parts is achieved with the said recording materials, so that it is possible to achieve not only exact image reproduction but, as a result of the high resolving power among other factors, also exact and correct reproduction of fine and very fine image elements. Particularly noteworthy, furthermore, is the high mechanical and chemical stability of the layers and lithographic printing plates produced using the said recording materials, in particular to aqueous and organic solvents and other chemicals with which they come into contact during their processing, in the case of lithographic printing plates, both on and off the printing press. According to the invention, high quality lithographic printing plates which permit exact reproduction of image and tonal value even for fine and very fine image elements and in the case of long print runs can be produced in this manner.

The Examples which follow illustrate the invention. Parts and percentages are by weight, unless stated otherwise.

EXAMPLE 1

A hydroxyl-containing resin having an OH equivalent weight of 270 was prepared by reacting the diglycidyl ether of bisphenol A and epichlorohydrin with adipic acid and acrylic acid in a molar ratio of 2:1:2.

148 parts (1 equivalent) of phthalic anhydride, 2.5 parts of dimethylaminopyridine, 1 part of di-tert.-butyl -p-cresol and 84 parts of ethyl acetate were added to 386 parts of this resin (70% strength in ethyl acetate), after which the reaction mixture was heated to 80° C. and kept at this temperature for 5 hours. Thereafter, in a second reaction stage, 40 parts of pentaerythritol triglycidyl ether and 2.5 parts of dimethylaminopyridine were added to the resulting reaction product. The reaction mixture was then kept at 80° C. for a further 5 hours, after which it was diluted with 259 parts of ethyl acetate and cooled to room temperature.

The solids content of the resin solution prepared in this manner was 46%. The acid number of the crosslinkable oligomeric resin containing acryloyl and free carboxyl groups was determined as 119 mg of KOH per g.

EXAMPLE 2

500 parts of the hydroxyl-containing starting resin used in Example 1 were mixed with 172.6 parts of phthalic anhydride, 1.3 parts of di-tert.-butyl-p-cresol, 3.2 parts of dimethylaminopyridine and 74 parts of ethyl acetate. This reaction mixture was heated to 77° C. and kept at this temperature for 4 hours. 81.2 parts of the diglycidyl ether prepared from bisphenol A and epichlorohydrin and 2.85 parts of dimethylaminopyridine, dissolved in 120 parts of ethyl acetate, were then added to the reaction solution. In the second reaction stage, this mixture was kept at 77° C. for 5 hours and then diluted with 260 parts of ethyl acetate and cooled to room temperature.

The solids content of the resin solution obtained in this manner was 49.6%. The acid number of the oligomeric resin containing acryloyl and free carboxyl groups was determined as 97 mg of KOH per g.

EXAMPLE 3

143.1 parts of the oligomeric resin solution prepared as described in Example 2, 20 parts of trimethylolpropane triacrylate, 6 parts of benzophenone, 2 parts of Michler's ketone and 1 part of Victoria Sky Blue B (C.I. 44,045) were dissolved in 1839.5 parts of tetrahydrofuran. This solution was applied onto an electrochemically roughened and anodically oxidized aluminum sheet for offset plates so that, when the solvent was evaporated and the layer dried for 2 minutes at 80° C., a dry layer about 2 μm thick resulted (weight per unit area of the layer: 2 g/m²).

The photosensitive recording element produced in this manner was exposed imagewise to actinic light through a photographic negative for 12 seconds in an exposure unit typically used for offset plates, and then washed out with an aqueous alkaline solution having a pH of from 11 to 12. The resulting lithographic printing plate exhibited excellent resolution. Both negative and positive lines of 6 μm width were reproduced satisfactorily. The plate gave extremely exact reproduction of image and tonal value, even after more than 25,000 prints.

We claim:

1. A crosslinkable oligomeric resin which is soluble or dispersible in an aqueous alkaline solution, contains acryloyl and/or methacryloyl groups and free carboxyl groups and has a mean molecular weight (number average) of from about 1,000 to 10,000 and an acid number of from 50 to 150, obtained by reacting a diol or polyol compound containing one or more (meth)acryloyl groups with a polyfunctional carboxylic acid or a cyclic anhydride of a polyfunctional carboxylic acid, with formation of an acidic partial ester of the carboxylic acid, and then subjecting some of the free carboxyl groups of the resulting reaction product to a chain-extending reaction with a diepoxide and/or a polyepoxide.

2. A crosslinkable, oligomeric resin according to claim 1, which contains on average about 2.1–8 acrylic and/or methacrylic double bonds per molecule.

3. A crosslinkable, oligomeric resin according to claim 1, which has an acid number of from 60 to 120.

4. A crosslinkable, oligomeric resin according to claim 1, wherein the mean molecular weight (number average) is from about 1,500 to 6,000.

5. A crosslinkable, oligomeric resin according to claim 1, wherein the (meth)acryloyl-containing diol or polyol compound is a reaction product of an aliphatic, cycloaliphatic or aromatic di- or polyepoxide with an equivalent amount of acrylic acid and/or methacrylic acid.

6. A crosslinkable, oligomeric resin according to claim 1, wherein the polybasic carboxylic acid or derivative thereof is a dicarboxylic acid or a cyclic carboxylic anhydride.

7. A crosslinkable, oligomeric resin according to claim 1, wherein an aliphatic or aromatic diglycidyl compound and/or an aliphatic or aromatic triglycidyl compound is or are used for the conversion of the free carboxyl groups of the reaction product obtained as an intermediate.

8. A crosslinkable, oligomeric resin according to claim 1, wherein, in its preparation, virtually all hydroxyl groups of the (meth)acryloyl-containing diol or polyol compound are reacted with the polyfunctional carboxylic acid or the cyclic anhydride of a polyfunctional carboxylic acid, and the free carboxyl groups of the resulting reaction product are reacted with the di- and/or polyepoxide in amounts such that the ratio of the number equivalents of COOH groups to that of glycidyl groups is from 1:0.8 to 1:0.2.

* * * * *